United States Patent
Elze et al.

(10) Patent No.: US 8,797,045 B2
(45) Date of Patent: Aug. 5, 2014

(54) DEVICE FOR DETECTING PARTIAL DISCHARGE IN AN INSULATION SYSTEM OF ROTARY ELECTRIC MACHINES

(75) Inventors: Hendrik Elze, Dresden (DE); Stefan Kornhuber, Dresden (DE)

(73) Assignee: Doble Lemke GmbH, Kesselsdorf (DE)

( * ) Notice: Subject to any disclaimer, the term of this patent is extended or adjusted under 35 U.S.C. 154(b) by 374 days.

(21) Appl. No.: 13/071,530

(22) Filed: Mar. 25, 2011

(65) Prior Publication Data
US 2012/0242348 A1    Sep. 27, 2012

(51) Int. Cl.
*H01H 31/12*    (2006.01)

(52) U.S. Cl.
USPC .............. 324/551; 324/536; 324/547; 324/87

(58) Field of Classification Search
USPC ......... 324/76.76, 87, 536, 541, 546, 547, 551
See application file for complete search history.

(56) References Cited

U.S. PATENT DOCUMENTS

| | | | |
|---|---|---|---|
| 2,967,274 A * | 1/1961 | Hurvitz | 324/76.32 |
| 4,853,818 A * | 8/1989 | Emery et al. | 361/33 |
| 5,940,347 A * | 8/1999 | Raida et al. | 367/138 |
| 5,990,687 A * | 11/1999 | Williams | 324/529 |
| 6,130,540 A * | 10/2000 | Achatz | 324/536 |
| 6,809,523 B1 * | 10/2004 | Ahmed et al. | 324/520 |
| 2004/0140864 A1 * | 7/2004 | Chen et al. | 333/126 |
| 2009/0177420 A1 * | 7/2009 | Fournier et al. | 702/59 |
| 2010/0259280 A1 * | 10/2010 | Thiede et al. | 324/547 |
| 2010/0263001 A1 * | 10/2010 | Nippa et al. | 725/67 |
| 2011/0181371 A1 * | 7/2011 | Alkan et al. | 333/132 |
| 2011/0291666 A1 * | 12/2011 | Steineke et al. | 324/551 |

FOREIGN PATENT DOCUMENTS

| | | |
|---|---|---|
| DE | 10134790 A1 | 1/2003 |
| DE | 10218951 A1 | 11/2004 |

* cited by examiner

*Primary Examiner* — Huy Q Phan
*Assistant Examiner* — Dustin Dickinson
(74) *Attorney, Agent, or Firm* — Gudrun E. Huckett

(57) ABSTRACT

A device for determining partial discharge in an insulation system of a rotating electrical machine with low capacitance decoupling has a coupler as a high pass and an adapter device connected or connectable to the coupler. The adapter device has a frequency separating filter for dividing a decoupled signal provided by the coupler into a high frequency signal and a low frequency signal. A mixer is provided for the high frequency signal and the low frequency signal for converting the high frequency signal. An output is provided where the converted high frequency signal is tapped for evaluation by an evaluation device connectable to the adapter device.

10 Claims, 2 Drawing Sheets

DEVICE FOR DETECTING PARTIAL DISCHARGE IN AN INSULATION SYSTEM OF ROTARY ELECTRIC MACHINES

BACKGROUND OF THE INVENTION

The invention concerns devices for detecting partial discharge in insulation system of rotating electrical machines with low capacitance decoupling.

Pre-installed partial discharge couplers on high-voltage stator windings of rotating electrical machines in the form of generators and motors are known. Measuring the pulse amplitude is realized at the base of each coupler. They are designed for high frequency measurement of partial discharge in the frequency range above 40 MHz. The couplers have a strong high pass effect so that measurement and as a result thereof local depth of the measurement is limited.

SUMMARY OF THR INVENTION

The invention has the object to determine partial discharge in the insulation system of rotating machines in a simple and reliable way.

This object is solved by the features:
a) coupler as high pass and
b) an adapter device for the coupler that is connected or connectable with the coupler, comprising.
a frequency separating filter for dividing the decoupled signal into a high frequency signal and a low frequency signal
a mixer for the high frequency signal and the low frequency signal for converting the high frequency signal,
so that at least the converted high frequency signal can be tapped at the adapter device and can be evaluated by an evaluation device connectable to the adapter device.

The devices for determining partial discharge in the insulation systems of rotating electrical machines with low capacitance decoupling are distinguished in particular in that the partial discharge in the insulation system can be detected in a simple and reliable way.

For this purpose, to each of the stator windings a coupler as a high pass is connected. An adapter device with a frequency separating filter for dividing the decoupled signal into a high frequency signal and a low frequency signal and a mixer for converting the high frequency signal are connected or connectable to the coupler. At least the converted high frequency signal can therefore be tapped at the adapter device and can be evaluated by means of an evaluation device that is connectable to the adapter device.

Rotating electrical machines are in particular motors or generators. Disruptions or defects in an insulation system, in particular in the stator, cause partial discharges in operation of the rotating electrical machines. They cause, in turn, high frequency signals advancing within the windings.

In connection with the housing and further components of the electrical machines reflections occur so that the signal of the partial discharge is a noisy frequency mix.

As is known in the art, the signal is decoupled by means of a measuring impedance acting as a coupler that converts the recharge current of the coupling capacitor connected in parell to the stator winding inyo a charge-equivalent voltage signal; the recharge current is caused by the partial discharge. The coupler is positioned within the ground branch of the coupling capacitor so that the ground connection of the electrical machine is maintained.

The signal reaches the frequency separating filter of the adapter device with downstream mixer. In this connection, the decoupled high frequency signal is converted into an equivalent signal of smaller evaluatable frequency.

In this way, smaller coupling capacitors for converting the signals that are caused by the partial discharges can be used so that also partial discharges in the electrical machine that occur far removed from the coupling location of the coupler can be detected and evaluated.

Advantageously, the partial discharge signals are thus decoupled and quantified in a parameter that is proportional to the pulse charge even though the strong high pass effect of the coupler (signal surface area loss by soft vibrations) is in conflict therewith.

The evaluation is realized by means of a known data processing system.

The frequency separating filter is a waveguide transformer.

The waveguide transformer separates advantageously by means of its minimal inductance the low frequency current signal (operating frequency 50 Hz or 60 Hz) and the high frequency voltage drop (partial discharge signal). At the same time, the electrical isolation of the waveguide transformer has the effect that both signal components are separated and are separately processed in separate signal paths.

According to one embodiment, the outputs of the frequency separating filter are connected to a high pass filter and a low pass filter. Moreover, the outputs of the high pass filter and of the low pass filter are connected to the mixer.

The output of the high pass filter is connectable to an additional low pass filter that, by means of a switch, can be either connected or bypassed. Accordingly, the low pass filter as well as the high pass filter, or the high pass filter with the additional low pass filter arranged downstream, can be connected to the mixer. In this way, this signal path is imparted with bandpass properties. Accordingly, the upper limit frequency of, for example, 20 MHz, can be lowered to, for example, 500 kHz.

To the output of the low pass filter, a serial connection is connected that is comprised of a first operational amplifier acting as a current voltage converter, a DC decoupler, and a second operational amplifier acting as an integrator. Moreover, the output of the second operational amplifier acting as an integrator is connected to the mixer. DC refers to direct current.

According to one embodiment the output of the high pass filter is an output PD OUT, the output of the mixer an output composite PD+U, and the output of low pass filter an output U OUT of the adapter device.

The coupler has a coupling capacitor with a capacitance of less than 500 pF, preferably 300 pF, for example, 80 pF.

The mixer is comprised of linear components.

The coupler with low capacitance decoupling of partial discharge signals is connectable or connected to the adapter device such that by means of the adapter device signals exist that can be tapped with a magnitude proportional to the pulse charge (signal time surface area) of the partial discharge signals, even though the strong high pass action of the coupler (signal surface area loss by undershooting) is in conflict therewith. This enables a measurement according to IEC 60270, which is not possible without adapter device.

BRIEF DESCRIPTION OF THE DRAWINGS

One embodiment of the invention is illustrated in the drawings in a basic illustration and will be explained in the following in more detail.

It is shown in.

DRESCRIPTION OF PREFERRED EMBODIENTS

A device for determining partial discharges in the insulation system of rotating electrical machines with low capacitance decoupling is comprised substantially of a coupler 1 and an adapter device 2 for at least the converted high frequency signal.

Figure 1:
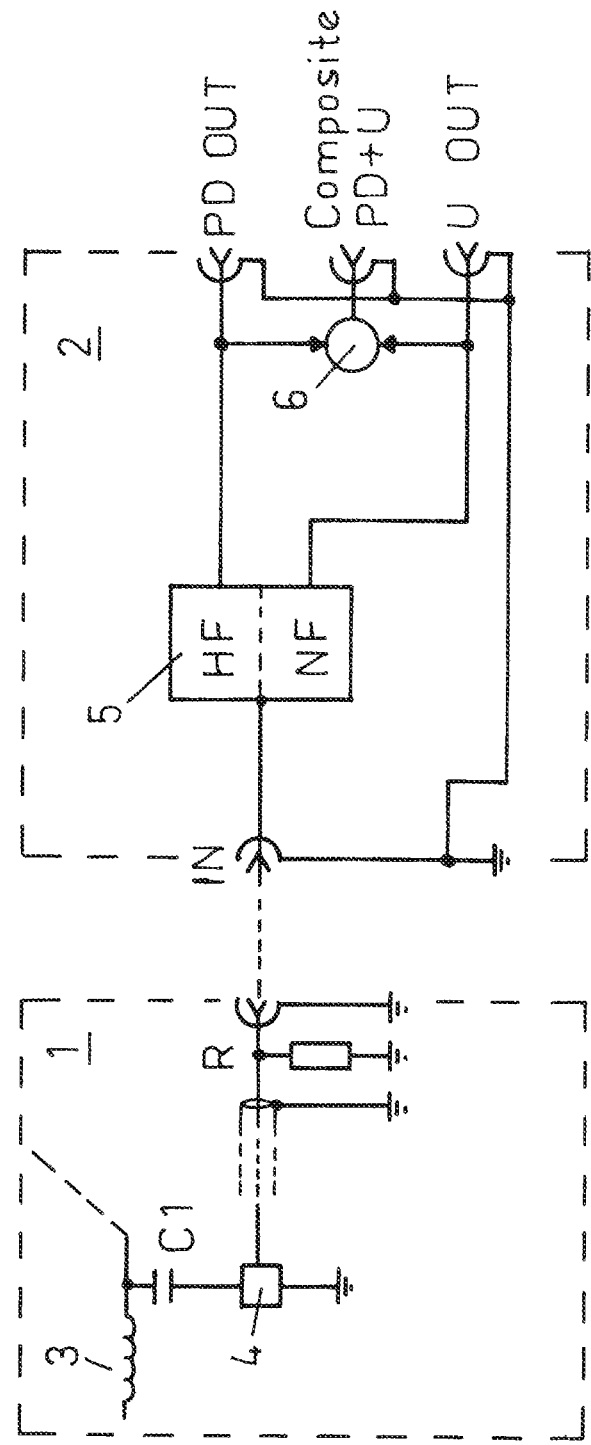
FIG. 1 a device for determining partial discharges in the insulation system of rotating electrical machines.

FIG. 1 shows a device for determining partial discharges in the insulation system of rotating electrical machines in a basic illustration.

The coupler 1 is a high pass, for example, on each of the stator windings 3 of a rotating electrical machine.

The coupler 1 comprises a coupling capacitor C1 with a capacity of less than 500 pF, for example, 80 pF. The coupler 1 terminates with an overvoltage protection 4 and a resistor R1.

With the coupler 1, the adapter device 2 is connected or connectable that comprises
  a frequency separating filter 5 for dividing the decoupled signal into a high frequency signal (schematically indicated by HF in the block symbolizing the filter 5) and a low frequency signal,(schematically indicated by NF in the block symbolizing the filter 5), and
  a mixer 6 for the high frequency signal and the low frequency signal for converting the high frequency signal.

Figure 2:
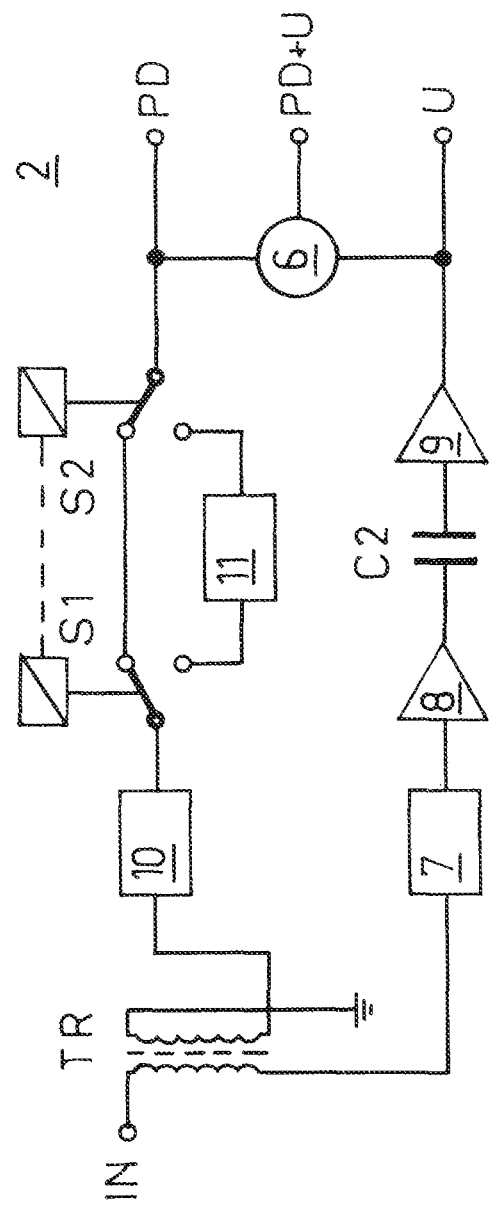
FIG. 2 an adapter device.

FIG. 2 shows an adapter device in a basic illustration.

The input signal passes from the input jack INPUT to a waveguide transformer TR that, at the same time, contributes with its comparatively minimal inductance (55 µH) to the separation between low frequency current signal (operational frequency 50 Hz or 60 Hz) and high frequency voltage drop (partial discharge signal). At the same time, the electrical isolation of the waveguide transformer TR has the effect that both signal components are separated and can be further processed separately in separate signal paths.

The low pass filter 7 ensures that residues of particularly strong partial discharge pulses will not reach the downstream circuitry and overload it. This is in particular an LC member. The current that is discharged from the coupler 1 to ground is received completely by the first operational amplifier 8 (acting as inventer) and is converted by means of the negative feedback resistor of the first operational amplifier 8 into a voltage signal and is simultaneously inverted. The first operational amplifier 8 is thus a current-voltage converter. In the downstream second operational amplifier 9, this signal is again inverted so that the output signal has the same phase orientation as the high voltage signal. In this connection, the DC decoupling from the first operational amplifier 8 by means of capacitor C2 is important in order to prevent integration of the offset voltage of the first operational amplifier 8 (acting as inventer). This active circuit with the operational amplifiers 8, 9 ensures that the input is at low frequency virtual ground potential. Therefore, the effect of the terminating resistor located in the adapter device 2 can be eliminated. The resulting image of the testing voltage is therefore present at the output "voltage OUT" and is applied at the same time to the mixer 6 (addition) where the voltage signal and the partial discharge signal are superimposed. (This applies in case of partial discharge detectors that have a composite input PD+U.)

The function of the partial discharge signal path is based on the conventional 50 ohm technology. The HF signal that drops at the terminals of the waveguide transformer TR passes first through a high pass filter 10 of third order in order to eliminate mains-frequency residues of the testing voltage. The high pass filter 10 is an LC member. By means of switches S1 and S2 acting as relay contacts, a 500 kHz low pass filter can be connected as an additional low pass filter 11 to the signal path so that then signal path has bandpass properties. The additional low pass filter 11 is an LC chain. Accordingly, the upper limit frequency of, for example, 20 MHz (without low pass) can be lowered to, for example, 500 kHz. The resulting partial discharge signal is applied to output PD OUT. Moreover, the resulting partial discharge signal is applied to the mixer 6 which provides the composite signal composite PD+U. In order to prevent mutual interactions of the outputs PD and U, decoupling comprised of capacitors and inductances is provided in the mixer 6.

What is claimed is:

1. A device for determining partial discharge in an insulation system of a rotating electrical machine with low capacitance decoupling, the device comprising:
  a coupler as a high pass;
  an adapter device connected or connectable to the coupler, wherein the adapter device comprises:
    a frequency separating filter for dividing a decoupled signal provided by the coupler into a high frequency signal and a low frequency signal, wherein the frequency separating filter is a waveguide transformer;
    a mixer for the high frequency signal and the low frequency signal for converting the high frequency signal,
    an output where the converted high frequency signal is tapped for evaluation by an evaluation device connectable to the adapter device;
  wherein the adapter device comprises a high pass filter and a first low pass filter, wherein outputs of the frequency separating filter are connected to the high pass filter and the first low pass filter, and wherein an output of the high pass filter and an output of the first low pass filter are connected to the mixer;
  wherein the adapter device comprises a second low pass filter and comprises at least one switch downstream of the output of the high pass filter, wherein the at least one switch is switchable such that the output of the high pass filter is either connected to the second low pass filter or bypasses the second low pass filter so that the first low pass filter and the high pass filter or the first low pass filter and the high pass filter with the downstream second low pass filter are connected to the mixer.

2. A device for determining partial discharge in an insulation system of a rotating electrical machine with low capacitance decoupling, the device comprising:
  a coupler as a high pass;
  an adapter device connected or connectable to the coupler, wherein the adapter device comprises:
    a frequency separating filter for dividing a decoupled signal provided by the coupler into a high frequency signal and a low frequency signal , wherein the frequency separating filter is a waveguide transformer;
    a mixer for the high frequency signal and the low frequency signal for converting the high frequency signal,
    an output where the converted high frequency signal is tapped for evaluation by an evaluation device connectable to the adapter device;
  wherein the adapter device comprises a high pass filter and a first low pass filter, wherein outputs of the frequency separating filter are connected to the high pass filter and the first low pass filter, and wherein an output of the high pass filter and an output of the first low pass filter are connected to the mixer;

wherein the adapter device comprises, connected in series, a first operational amplifier as a current voltage converter connected to the output of the low pass filter, a DC decoupler connected downstream of the first operational amplifier, and a second operational amplifier as integrator connected downstream of the DC decoupler, wherein an output of the second operational amplifier is connected to the mixer.

3. The device according to claim 1, wherein the output of the high pass filter is an output PD OUT of the adapter device, the output of the mixer is an output composite PD+U of the adapter device, and the output of the low pass filter is an output U OUT of the adapter device.

4. The device according to claim 1, wherein the coupler comprises a coupling capacitor with a capacitance of less than 500 pF.

5. The device according to claim 1, wherein the mixer is comprised of linear components.

6. The device according to claim 1, wherein the coupler provides low capacitance decoupling of partial discharge signals, wherein the coupler is connected or connectable to the adapter device such that signals exist at the adapter device that are tapped with a magnitude proportional to the pulse charge of the partial discharge signals, and wherein the coupler has a strong high pass action in conflict therewith.

7. The device according to claim 2, wherein the output of the high pass filter is an output PD OUT of the adapter device, the output of the mixer is an output composite PD+U of the adapter device, and the output of the low pass filter is an output U OUT of the adapter device.

8. The device according to claim 2, wherein the coupler comprises a coupling capacitor with a capacitance of less than 500 pF.

9. The device according to claim 2, wherein the mixer is comprised of linear components.

10. The device according to claim 2, wherein the coupler provides low capacitance decoupling of partial discharge signals, wherein the coupler is connected or connectable to the adapter device such that signals exist at the adapter device that are tapped with a magnitude proportional to the pulse charge of the partial discharge signals, and wherein the coupler has a strong high pass action in conflict therewith.

* * * * *